(12) United States Patent
Penney

(10) Patent No.: US 10,985,738 B1
(45) Date of Patent: Apr. 20, 2021

(54) HIGH-SPEED LEVEL SHIFTER

(71) Applicant: Micron Technology, Inc., Boise, ID (US)

(72) Inventor: Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/781,875

(22) Filed: Feb. 4, 2020

(51) Int. Cl.
*H03K 19/0175* (2006.01)
*H03K 3/356* (2006.01)
*G11C 11/4093* (2006.01)

(52) U.S. Cl.
CPC .... *H03K 3/356113* (2013.01); *G11C 11/4093* (2013.01); *H03K 3/356017* (2013.01)

(58) Field of Classification Search
CPC ....... H03K 19/0185; H03K 19/018507; H03K 19/018514; H03K 19/018521; H03K 19/018528; H03K 19/0175; H03K 19/017509; H03K 3/356017; G11C 11/4093; G11C 7/1057; G11C 7/1078; G11C 7/1084
See application file for complete search history.

(56) References Cited

U.S. PATENT DOCUMENTS

| | | | |
|---|---|---|---|
| 6,002,290 A | 12/1999 | Avery et al. | |
| 2004/0246024 A1 | 12/2004 | Brede et al. | |
| 2008/0136489 A1* | 6/2008 | Nojiri | H03K 3/012 327/333 |
| 2011/0227626 A1* | 9/2011 | Sakurai | H03K 19/0175 327/333 |

* cited by examiner

*Primary Examiner* — Long Nguyen
(74) *Attorney, Agent, or Firm* — Fletcher Yoder, P.C.

(57) ABSTRACT

Embodiments disclosed herein relate to level shifters of a memory device. Specifically, the level shifters include a first series arrangement of transistors to offset a first transistor. The level shifters also include a second series arrangement of transistors to offset a second transistor. The first series arrangement of transistors is opposite the second series arrangement of transistors. The output of the first series arrangement of transistors is coupled to a first node and selectively couples the first node to a first voltage based on an input signal. The output of the second series arrangement of transistors is coupled to a second node and couples the second node to the first voltage based on an input signal. The first node and the second node are coupled to the first voltage at different times. The series arrangements of transistors enables faster level shifting over conventional level shifters.

20 Claims, 4 Drawing Sheets

HIGH-SPEED LEVEL SHIFTER

BACKGROUND

Field of the Present Disclosure

Embodiments of the present disclosure relate generally to the field of semiconductor devices. More specifically, embodiments of the present disclosure relate to a high-speed voltage level shifter.

Description of Related Art

Semiconductor devices (e.g., memory devices) may utilize a level shifter. For instance, dynamic random-access memory (DRAM) devices may use a level shifter to allow compatibility between integrated circuits (ICs) of the DRAM devices. For example, a first IC of a DRAM device may utilize a first voltage (about 1.8 volts) while a second IC of the DRAM device utilizes a second voltage (3.3 volts). In order for the first and second ICs to be compatible for use in the same DRAM device, a level shifter may increase an output of the first IC to the second voltage for use by the second IC. However, level shifters may be speed limited and unsuitable for some high-speed operations.

Embodiments of the present disclosure may be directed to address one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices exchange data and store the data in memory banks. For data to flow through the memory devices, level shifters may be used to ensure proper shifting between voltage levels for the various ICs, or within an IC, of the memory devices. Embodiments disclosed herein provide improved performance and increased speed compared to conventional level shifters.

Figure 1:
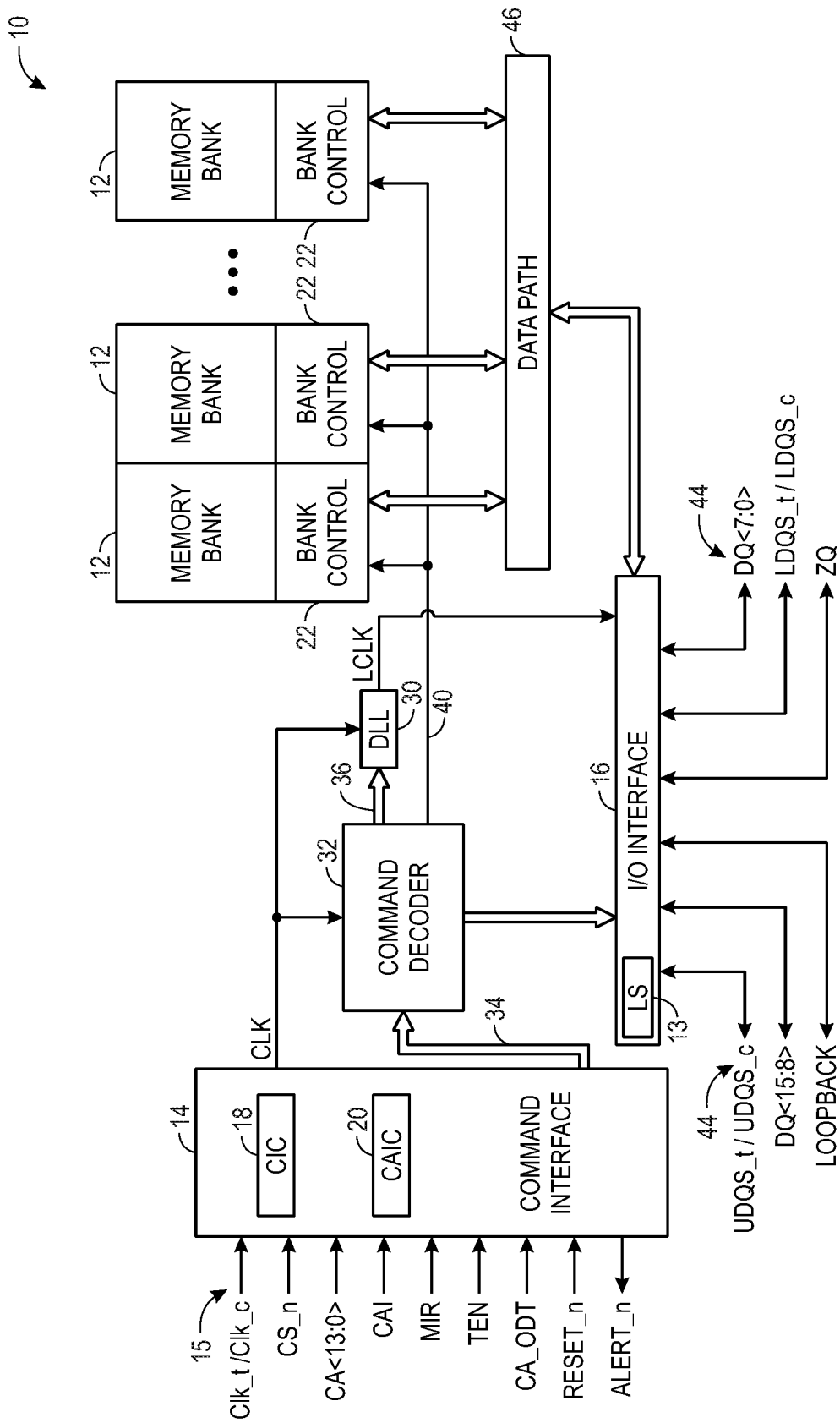
FIG. 1 is a simplified block diagram illustrating some features of a memory device, according to an embodiment of the disclosure.

FIG. 1 is a simplified block diagram illustrating some features of a memory device 10. In accordance with one embodiment, the memory device 10 may be a double data rate type five synchronous dynamic random access memory (DDR5 SDRAM) device. Various features of DDR5 SDRAM allow for reduced power consumption, increased bandwidth, and increased storage capacity compared to prior generations of DDR SDRAM. The memory device 10 represents a portion of a single memory chip (e.g., SDRAM chip) having a number of memory banks 12. The memory banks 12 may be, for example, DDR5 SDRAM memory banks. The memory banks 12 may be disposed on one or more chips (e.g., SDRAM chips) arranged on dual inline memory modules (DIMMS). Each DIMM may include a number of SDRAM memory chips (e.g., eight or sixteen memory chips). Each SDRAM memory chip may include one or more memory banks 12.

For DDR5, the memory banks 12 may be arranged to form bank groups. For example, the memory chip may include sixteen memory banks 12 for an eight gigabyte (8 Gb) DDR5 SDRAM. The memory banks 12 may be arranged into eight memory bank groups, each memory bank group including two memory banks. For a sixteen gigabyte (16 Gb) DDR5 SDRAM, the memory chip may include thirty-two memory banks 12, arranged into eight memory bank groups, each memory bank group including four memory banks 12, for instance.

Various other configurations, organizations, and sizes of the memory banks 12 on the memory device 10 may be utilized depending on the application and design of the overall system. In one embodiment, each memory bank 12 includes a bank control block 22, which controls execution of commands to and from the memory banks 12 for performing various functionality in the memory device, such as decoding, timing control, data control, and any combination thereof.

The memory device 10 may include a level shifter 13 that changes between an input voltage and an output voltage. The illustrated level shifter 13 may be located in an input/output (I/O) interface 16. Additionally or alternatively, the level shifter 13 may be located in other components of the memory device 10, such as a datapath 46 or a command interface 14. In some embodiments, the level shifter 13 may be located in more than one component and/or may be located between components of the memory device 10. Furthermore, in some embodiments, the level shifter 13 may be used in other electronic devices other than the memory device 10.

The command interface 14 of the memory device 10 is configured to receive and transmit a number of signals (e.g., signals 15). The signals 15 may be received from an external device (not shown), such as a processor or controller. The processor or controller may provide various signals 15 to the memory device 10 to facilitate transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_c). A positive clock edge for DDR refers to the point where a rising true clock signal Clk_t/crosses a falling bar clock signal Clk_c. A negative clock edge indicates a transition of a falling true clock signal Clk_t and a rising of the bar clock signal Clk_c. Commands (e.g., read command, write command, etc.) are typically entered on the positive edges of the clock signal. Data may be transmitted or received on both the positive and the negative clock edges.

The clock input circuit 18 receives the true clock signal (Clk_t/) and the bar clock signal (Clk_c) and generates an internal clock signal, CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., four) phases. The clock input circuit 18 may also include phase detection circuitry to detect which phase receives a first pulse when sets of pulses occur too frequently to enable the clock input circuit 18 to reset between pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command via the bus path 40. As will be appreciated, the memory device 10 may include various other decoders, such as row decoders and column decoders, to facilitate access to the memory banks 12.

The memory device 10 executes operations, such as read commands and write commands, based on the command/address signals received from an external device, such as a processor. In one embodiment, the command/address bus 34 may be a 14-bit bus to accommodate the command/address signals (CA<13:0>). The command/address signals 15 are clocked to the command interface 14 using the clock signals (Clk_t/ and Clk_c). The command interface 14 may include a command address input circuit 20 which is configured to receive and transmit the commands to provide access to the memory banks 12 through the command decoder 32. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus 34, for instance, depending on the command/address routing for the particular memory device 10. A mirror (MIR) signal may also be provided to facilitate a mirror function. The MIR signal may be used to multiplex signals so the signals can be swapped to enable certain routing of signals to the memory device 10, based on the configuration of multiple memory devices (such as memory device 10) in a particular application. Various signals to facilitate testing of the memory device 10, such as the test enable (TEN) signal, may be provided as well. For instance, the TEN signal may be used to place the memory device 10 into a test mode for connectivity testing.

The command interface 14 may also be used to provide an alert signal (ALERT_n) to the system processor or controller for errors that may be detected. For instance, the alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during some operations, such as the connectivity test mode executed using the TEN signal, as described above.

Data may be sent to and from the memory device 10, utilizing the command and clocking signals 15 discussed above, by transmitting and receiving data signals 44 through the I/O interface 16. More specifically, the data may be sent to or retrieved from the memory banks 12 over the datapath 46, which includes a plurality of bi-directional data buses. Data I/O signals, generally referred to as DQ signals, are generally transmitted and received in one or more bi-directional data busses. For particular memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, some memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals may be used as clock signals to capture the corresponding input data. As with the clock signals (Clk_t/ and Clk_c), the DQS signals may be provided as a differential pair of data strobe signals (DQS_t/ and DQS_b) to provide differential pair signaling during reads and writes. For some memory devices, such as a DDR5 SDRAM memory device, the differential pairs of DQS signals may be divided into upper and lower data strobe signals (e.g., UDQS_t/ and UDQS_b; LDQS_t/and LDQS_b) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage, and temperature (PVT) values. Because PVT characteristics may affect the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/

VSS external to the memory device 10. This resistor acts as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is provided to highlight some functional features of the memory device 10 to aid in the subsequent detailed description. Furthermore, although the foregoing has discussed a DDR5 memory device, the level shifters discussed herein may be used in any type of electronic device and/or other types of memory, such as a double-data rate type 4 DRAM (DDR4) memory device.

Figure 2:
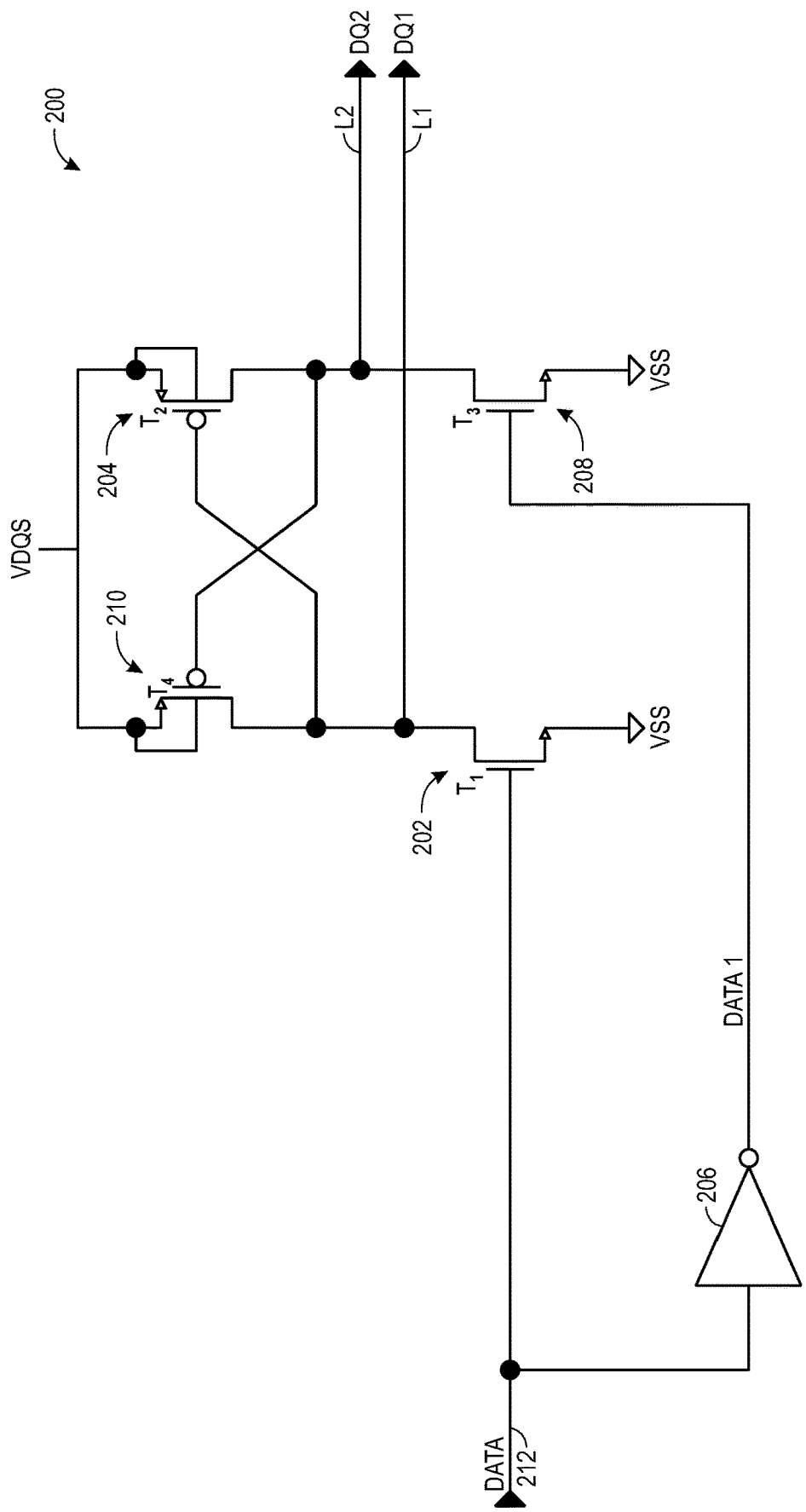
FIG. 2 is a circuit diagram of a voltage level shifter.

FIG. 2 is a circuit diagram of a voltage level shifter 200. The level shifter 200 may correspond to the level shifter 13 discussed with respect to FIG. 1. The level shifter 13 may include a transistor 202 ($T_1$), a transistor 204 ($T_2$), an inverter 206, a transistor 210 ($T_4$), and a transistor 208 ($T_3$). In one embodiment, the transistor 204 ($T_2$) and the transistor 210 ($T_4$) are p-channel transistors while the transistor 202 ($T_1$) and the transistor 208 ($T_3$) are n-channel transistors. That is, a logic-high voltage applied to the gate of the n-channel transistors turns on the transistors 202 ($T_1$), 208 ($T_3$) such that current flows between the source and drain thereof. Conversely, the logic-high voltage applied to the gate of the p-channel transistors turns off the transistors 204 ($T_2$), 210 ($T_4$) such that current does not flow therethrough. It is to be understood that alternative embodiments of the voltage level shifter 200 may include the transistors 202 ($T_1$), 204 ($T_2$), 208 ($T_3$), 210 ($T_4$) having different types (n-channel or p-channel) and may be disposed in a different configuration than shown.

An input signal DATA is supplied along an input line 212. The input line 212 is coupled to a gate of the transistor 202 ($T_1$) and the inverter 206. In the following example, for the sake of discussion, the input signal DATA on the input line 212 is assumed to be a logic high (e.g., 1) or transitioning from a logic low to a logic high (e.g., from 0 to 1). The logic high is supplied to a gate of the transistor 202 ($T_1$) that causes a logic low signal (e.g., 0, VSS) to be coupled to a gate of the transistor 204 ($T_2$). This logic low signal supplied to the gate of the transistor 204 ($T_2$) is also output from the voltage level shifter 200 as a first output signal DQ1 on a first output line L1. The application of the logic low signal to the gate of the transistor 204 ($T_2$) causes the transistor 204 ($T_2$) to couple a logic high signal (e.g., 1, VDQS) to a gate of the transistor 210 ($T_4$). The logic high signal is also transmitted to a second output signal DQ2 on a second output line L2. As such, the logic high signal may have an appropriate voltage level to be output via the second output signal DQ2 on a second output line L2 that is different from the logic high level of the input signal DATA. This change in level is the level shift performed in the voltage level shifter 200.

The inverter 206 provides an inverted input signal DATA1 to a gate of the transistor 208 ($T_3$). When the input signal DATA on the input line 212 is a logic high, the inverted input signal DATA1 is low causing the transistor 208 ($T_3$) to decouple the second output signal DQ2 on the second output line L2 from the low voltage VSS and to maintain the logic high level. When the input signal DATA is a logic low, the inverted input signal DATA1 is a logic high causing inverse operation of the voltage level shifter 200. One or more buffers (not shown) may be disposed on one or both of the first and second output lines L1, L2 to protect electronics or equipment coupled thereto.

The output signals DQ1, DQ2 of the voltage level shifter 200 may be delayed by the number of gate transitions from the input signal DATA to the output signals DQ1, DQ2. For instance, when the input signal DATA transitions high, the first output signal DQ1 may transition low after a single transistor, the transistor 202 ($T_1$), toggles. However, the second output signal DQ2 does not toggle until the transistor 210 ($T_4$) is overpowered by the transistor 202 ($T_1$). That is, the transistor 210 ($T_4$) is physically small relative to the transistor 202 ($T_1$). The delay may be longer than suitable for a device incorporating the voltage level shifter 200. Thus, the level shifter 200 may not be suitable for high-speed operation of the memory device 10 discussed with respect to FIG. 1 and/or other high-speed electronic devices.

The relatively small size of the transistor 210 ($T_4$) and the transistor 204 ($T_2$) drive the first output signal DQ1 and the second output signal DQ2, respectively, to a logic high signal (e.g., 1, VDQS) with a relatively long rise time, for example between about 300 ps and about 700 ps, such as about 500 ps. The relatively large size of the transistor 202 ($T_1$) and the transistor 208 ($T_3$) pull down the first output signal DQ1 and the second output signal DQ2, respectively, to a logic low signal (e.g., 0, VSS) with a relatively short fall time, for example between about 25 ps and about 75 ps, such as about 50 ps.

Figure 3:
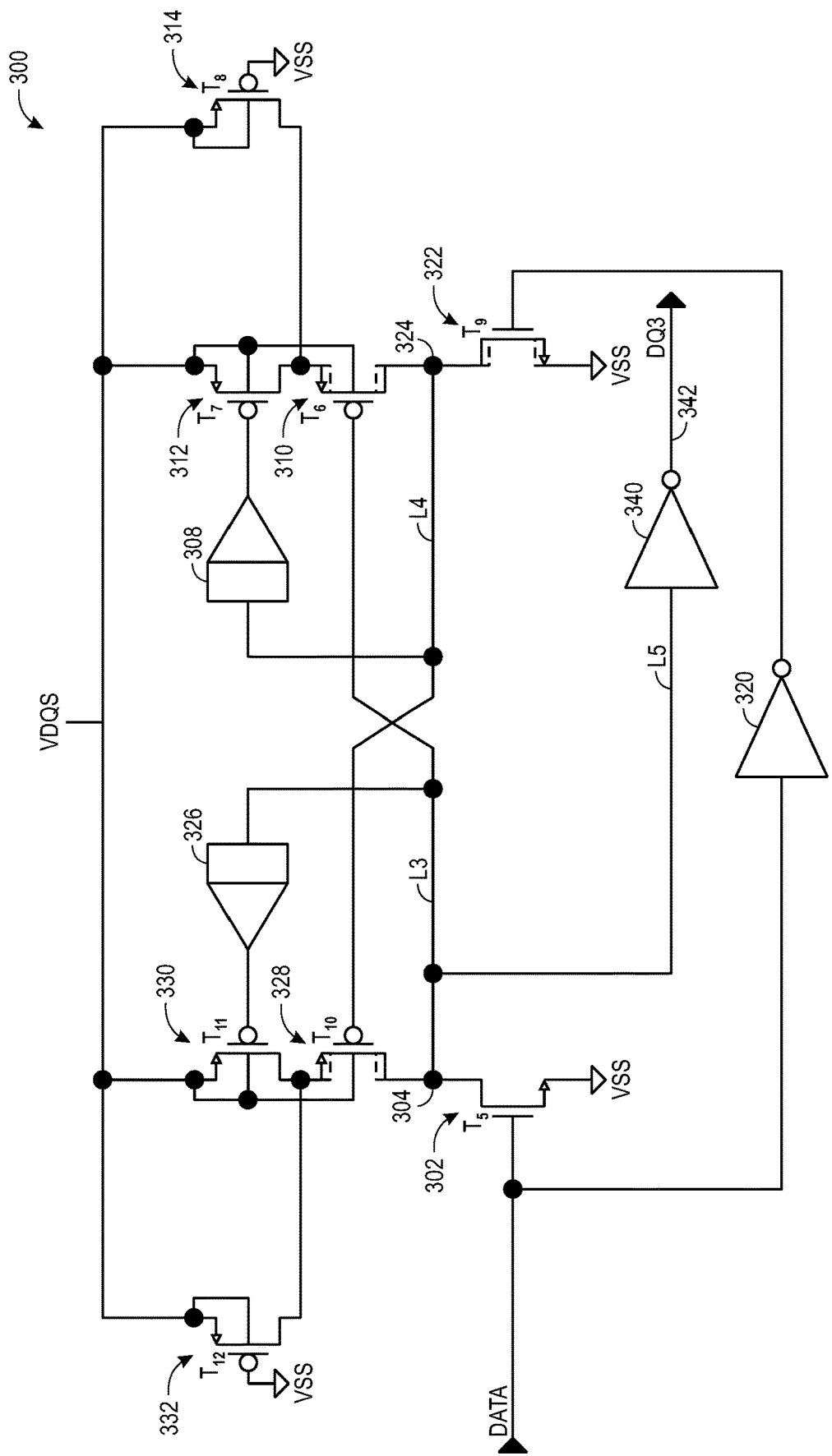
FIG. 3 is a circuit diagram of a high-speed voltage level shifter, according to an embodiment of the disclosure.

FIG. 3 is a circuit diagram of a high-speed level shifter 300, according to one embodiment of the disclosure. The level shifter 300 may correspond to the level shifter 13 discussed with respect to FIG. 1. For example, the high-speed level shifter 300 may be located in the I/O interface 16, the datapath 46, the command interface 14, or any combination thereof.

As illustrated, the level shifter 300 includes a transistor 302 ($T_5$), a transistor 310 ($T_6$), a transistor 312 ($T_7$), a transistor 314 ($T_8$), a transistor 322 ($T_9$), a transistor 328 ($T_{10}$), a transistor 330 ($T_{11}$), a transistor 332 ($T_{12}$), a first delay gate 308, a second delay gate 326, a first inverter 320, and a second inverter 340.

As illustrated, the transistor 302 ($T_5$) and the transistor 322 ($T_9$) may be n-channel transistors while the transistor 310 ($T_6$), the transistor 312 ($T_7$), the transistor 314 ($T_8$), the transistor 328 ($T_{10}$), the transistor 330 ($T_{11}$), and the transistor 332 ($T_{12}$) may be p-channel transistors. Furthermore, the transistor 322 ($T_9$) and the transistor 328 ($T_{10}$) may be low-voltage transistors to enable fast propagation. Some p-channel transistors may be weak compared to the corresponding n-channel transistors. For instance, the transistor 314 ($T_8$) and the transistor 332 ($T_{12}$) are weak transistors and are always coupled to a logic low (e.g., 0, VSS) that may be rapidly overpowered by the respective transistor 302 ($T_5$) and the transistor 322 ($T_9$). It is to be understood that the transistors 302 ($T_5$), 310 ($T_6$), 312 ($T_7$), 314 ($T_8$), 322 ($T_9$), 328 ($T_{10}$), 330 ($T_{11}$), 332 ($T_{12}$) may be different types (n-channel or p-channel) and may be disposed in a different configuration than shown.

The transistor 314 (T8) and the transistor 332 (T12) may have a first size (e.g., a minimum width of about 440 nm and a minimum length of about 225 nm). The transistor 310 (T6), the transistor 312 (T7), and the transistor 330 (T11) may have a second size (e.g., a minimum width of about 3.3 μm and a minimum length of about 45 nm). The transistor 328 (T10) may have a third size (e.g., a minimum width of about 3.12 μm, and a minimum length of about 60 nm). The transistor 302 (T5) may have a suitable size (e.g., a minimum width of about 760 nm and a minimum length of about 45 nm). The transistor 322 (T9) may have a similar size (e.g., a minimum width of about 700 nm and a minimum length of about 72 nm).

In the following example, the input signal DATA is assumed to be high (e.g., 1) or transitioning from low to high (e.g., from 0 to 1) for the sake of discussion. The input signal DATA is coupled to the transistor 302 ($T_5$) and the first inverter 320. When the input signal DATA is received at a gate of the transistor 302 ($T_5$) as a logic high, the transistor 302 ($T_5$) couples the third node 304 to a low signal (e.g., 0, VSS). The third node 304 is coupled to a gate of the transistor 310 ($T_6$) along a third line L3.

With the third node 304 coupled to the low signal, the transistor 310 ($T_6$) couples a first node 324 to a logic high voltage (e.g., 1, VDQS) via the transistor 312 ($T_7$) that has a logic low applied to its gate from a previous cycle of the input signal DATA. The first node 324 is coupled to the logic high voltage via the transistor 310 ($T_6$) and the transistor 312 ($T_7$) until a duration set by the first delay gate 308 elapses after the transition of the input signal DATA due to the first delay gate 308. The first delay gate 308 and the second delay gate 326 receive and delay a signal for a predetermined timed delay, such as about 100 ps, thereby holding a previous signal at a respective gate of transistors for the predetermined delay. That is, after the duration of the first delay gate 308 elapses, the transistor 312 ($T_7$) decouples the first node 324 from the logic high via the transistor 312 ($T_7$) due to the first node 324 transitioning high. Thus, the signal from the first delay gate 308 cuts off the voltage pull-up at the first node 324 via the transistor 312 ($T_7$). Instead, after the initial pullup, the transistor 310 ($T_6$) is coupled to the logic high voltage via the relatively small transistor 314 ($T_8$). As may be appreciated, the transistor 314 ($T_8$) may be sufficiently sized to provide enough power to maintain the voltage at the first node 324 but small enough to enable the transistor 322 ($T_9$) to pull the voltage of the first node 324 down to the low voltage despite the connection via the transistor 314 ($T_8$).

For example, the first delay gate 308 may receive a signal from the first node 324. The signal is delayed by the first delay gate 308 at least until a voltage transition between logic low and logic high on the third node 304 and the first node 324 is complete and the predetermined delay has elapsed. As an example, the predetermined delay of the first delay gate 308 may be about 100 ps.

The second delay gate 326 operates in a similar fashion between the third node 304 and the transistor 330 ($T_{11}$). The first node 324 is coupled to a gate of the transistor 328 ($T_{10}$) via a fourth line L4. In the current example, the first node 324 is a logic high after being pulled up via the transistor 312 ($T_7$) and the transistor 310 ($T_6$). Accordingly, the transistor 328 ($T_{10}$) is turned off due to the logic high voltage applied to a gate of the transistor 328 ($T_{10}$) from the first node 324. That is, the third node 304 is not coupled to the logic high at least via the transistor 328 ($T_{10}$). After at least the predetermined delay, the second delay gate 326 supplies the output of the transistor 302 ($T_5$) (e.g., logic low) to the transistor 330 ($T_{11}$). That is, the transistor 330 ($T_{11}$) provides a partial path from the VDQS to the third node 304 after at least the predetermined delay has elapsed.

Conversely, if the input signal DATA is a logic low (e.g., 0), the input signal is inverted by the first inverter 320 and provides a logic high to the transistor 322 ($T_9$). The transistor 322 ($T_9$) pulls down the first node 324 to logic low (e.g., 0, VSS). The logic low is applied to a gate of the transistor 328 ($T_{10}$) that couples the third node 304 to a logic high voltage (e.g., 1, VDQS) via the transistor 330 ($T_{11}$). The logic high is received by the second delay gate 326 which, after the delay set by the second delay gate 326 elapses, causes the transistor 330 ($T_{11}$) to decouple the third node 304 from the logic high (e.g., 1, VDQS) via the transistor 330 ($T_{11}$). Thus, as the input signal DATA cycles between logic high and logic low, the cut-off by the second delay gate 326 creates a pulsed pull-up to logic high through the transistor 330 ($T_{11}$) after the delay set by the second delay gate 326. Instead, the connection of the logic high voltage to the third node 304 is passed through the relatively small transistor 332 ($T_{12}$) that functions similarly to the transistor 314 ($T_8$) with respect to the respective third node 304 and first node 324.

A first series arrangement of the transistor 310 ($T_6$) and the transistor 312 ($T_7$) provide a "burst" (i.e., fast) pull-up to the logic high (e.g., 1, VDQS) for a high input signal DATA. Similarly, a second series arrangement of the transistor 328 ($T_{10}$) and the transistor 330 ($T_{11}$) provide a "burst" pull-up to the logic high for a low input signal DATA. That is, the first and second series arrangements provide an increased speed to pull up an output DQ3 of the level shifter 300 measured from the third node 304 and/or the first node 324. The speed at which the first and second series arrangements pull up the output DQ3 is substantially symmetric to the pull down speed of the transistor 302 ($T_5$) and the transistor 322 ($T_9$).

The output DQ3 may be measured along a fifth line L5 coupled to the third node 304 or the first node 324. A second inverter 340 may be disposed on the fifth line L5. An output of the second inverter 340 on an output line 342 may be the output DQ3 of the level shifter 300. The second inverter 340 may act as a buffer amplifier to the output DQ3 to provide improved predictability of the output level between 0 and 1.

Based on the circuit diagram of the level shifter 300, a two-gate offset (e.g., two clock cycles) exists for the output DQ3 between a high input signal DATA and a low input signal DATA. In some embodiments, an additional complementary output may be taken from the first node 324 via a line (not shown) similar to the fifth line L5 which obtains the output DQ3 via the third node 304. Additionally or alternatively, a complementary output may be obtained by inverting the output DQ3 to obtain differential outputs for the high-speed level shifter 300.

Figure 4:
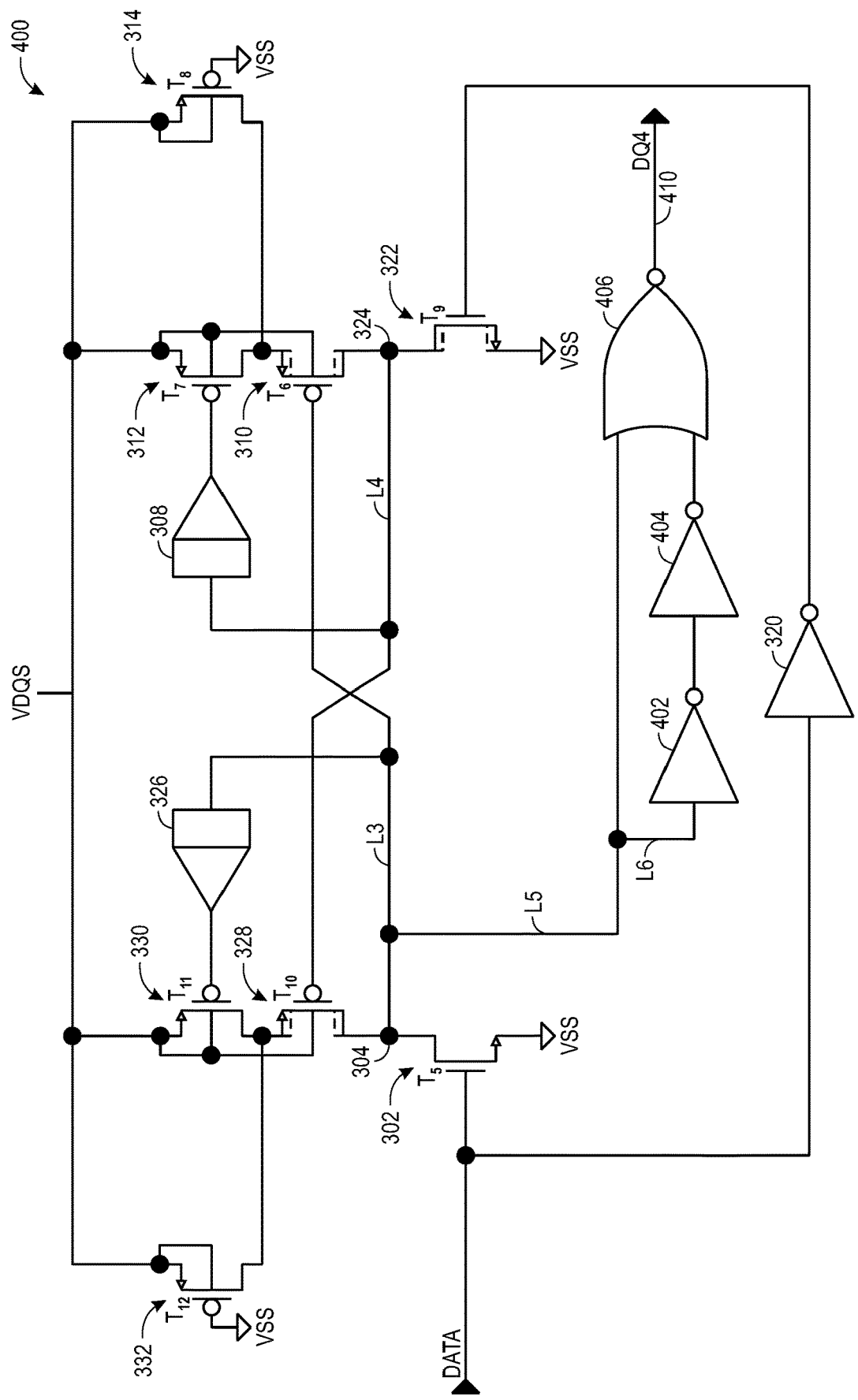
FIG. 4 is a circuit diagram of the high-speed level shifter of FIG. 3 with added circuitry for balancing a propagation delay, according to an embodiment of the disclosure.

FIG. 4 is a circuit diagram of a high-speed level shifter 400, according to another embodiment of the disclosure. The level shifter 400 is substantially similar to the high-speed level shifter 300 discussed with respect to FIG. 3 above. However, the level shifter 400 includes additional circuitry on an output line 410 in place of the second inverter 340, as shown in FIG. 3.

As illustrated, the level shifter 400 includes a sixth line L6 coupled to the fifth line L5. A third inverter 402 and a fourth inverter 404 are disposed in series on the sixth line L6. A NOR gate 406 is coupled to the fifth line L5 and the output of the fourth inverter 404 on the sixth line L6. An output of the NOR gate 406 is on an output line 410 of the level shifter 400.

As discussed above, a two gate offset exists for the output DQ3 between a high input signal DATA and a low input signal DATA. The third inverter 402 and the fourth inverter 404 balance the offset between the high input signal and the low input signal by creating a four-gate delay for the output of the level shifter 400, regardless of the input signal DATA. That is, the output of the level shifter 400 has a four gate delay after the input signal DATA is received. If a fast clock is used to change the input signal DATA, the two gate offset can create a large duty cycle for the high-speed level shifter 300. The additional circuitry added to the high-speed level shifter 400 in FIG. 4 balances the delay of the output signal for a change in the input signal DATA, which substantially reduces an occurrence of increasing the duty cycle for the level shifter.

Advantageously, the embodiments disclosed herein provide a symmetric pull-up speed compared to a pull-down speed. That is, the pull-up speed is increased for high-speed operation of the corresponding memory device. The increase in pull-up speed provides a balanced rise and fall time for the input, even though the level shifters described herein may consume an increased layout size and consume more power than other level shifters.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A voltage level shifter, comprising:
an input configured to receive a data signal;
a first node configured to provide an output for the voltage level shifter;
a first transistor coupled to the first node and configured to selectively couple the first node to a first voltage level based on the data signal;
a second transistor coupled to the first node;
a third transistor coupled to the second transistor and a second voltage level, wherein the third transistor is configured to provide a first relatively strong connection between the second transistor and the second voltage level for a period shorter than a duration of a pulse of the data signal; and
a fourth transistor coupled to the second transistor and the second voltage level in parallel with the third transistor, wherein the fourth transistor is configured to provide a relatively weak connection between the second transistor and the second voltage level due to the fourth transistor being smaller than the first transistor enabling the first transistor to overpower the relatively weak connection and move the first node to the first voltage level when the fourth transistor and the first transistor are both activated.

2. The voltage level shifter of claim 1, wherein the first transistor is an n-channel transistor.

3. The voltage level shifter of claim 1, wherein the second transistor, the third transistor, and the fourth transistor are p-channel transistors.

4. The voltage level shifter of claim 1, further comprising:
a first delay coupled to the first node and a gate of the third transistor, wherein the first delay is configured to cause the third transistor to selectively decouple the first relatively strong connection between the second transistor and the second voltage level after the period.

5. The voltage level shifter of claim 1, further comprising:
a first inverter configured to invert the input to generate an inverted data signal;
a fifth transistor coupled to a second node and configured to selectively couple the second node to the first voltage level based on the inverted data signal;
a sixth transistor coupled to the second node;
a seventh transistor coupled to the sixth transistor and the second voltage level, wherein the seventh transistor is configured to provide a second relatively strong connection between the sixth transistor and the second voltage level for a second period that has a duration shorter than a duration of a pulse of the inverted data signal; and
an eighth transistor coupled to the sixth transistor and the second voltage level in parallel with the seventh transistor, wherein the eighth transistor is configured to provide a second relatively weak connection between the sixth transistor and the second voltage level due to the eighth transistor being smaller than the fifth transistor enabling the fifth transistor to overpower the second relatively weak connection and move the second node to the first voltage level when the eighth transistor and the fifth transistor are both activated.

6. The voltage level shifter of claim 5, further comprising:
a second delay coupled to the second node and a gate of the seventh transistor, wherein the second delay is configured to cause the seventh transistor to selectively decouple the second relatively strong connection between the sixth transistor and the second voltage level after the second period.

7. The voltage level shifter of claim 6, wherein the first node is coupled to a gate of the sixth transistor and the second node is coupled to a gate of the second transistor.

8. A memory device, comprising:
a plurality of memory banks;
a command interface comprising a plurality of circuits and configured to receive a plurality of signals, wherein the plurality of signals cause the memory device to perform operations on the plurality of memory banks; and
a voltage level shifter coupled to the command interface, wherein the voltage level shifter comprises parallel level shifters each comprising:
an input configured to receive a data signal of the plurality of signals;
a node configured to provide an output for the voltage level shifter;

a first transistor coupled to the node and configured to selectively couple the node to a first voltage level based on the data signal;

a second transistor coupled to the node and configured to couple the node to a second voltage level; and a third transistor coupled to the node and configured to couple the node to the second voltage level, wherein the third transistor provides a relatively weak connection between the node and the second voltage level compared to a relatively strong connection between the node and the second voltage level via the second transistor.

9. The memory device of claim 8, wherein the second transistor, when activated, is configured to pull the node to the second voltage level faster than the third transistor is configured to pull up the node to the second voltage.

10. The memory device of claim 8, wherein each of the parallel level shifters each comprises:

a fourth transistor positioned between the node and the second transistor, wherein a gate of the fourth transistor is coupled to the node of an opposite parallel level shifter of the parallel level shifters.

11. The memory device of claim 8, wherein the input of one of the parallel level shifters is inverted before the input is received by the first transistor of the one of the parallel level shifters.

12. The memory device of claim 8, wherein each of the parallel level shifters each comprises:

a delay coupled to the node and the second transistor, wherein the delay is configured to selectively decouple the relatively strong connection between the node and the second voltage level via the second transistor based at least in part on a voltage of the node.

13. The memory device of claim 12, wherein the second transistor, third transistor, and fourth transistor are p-channel transistors.

14. The memory device of claim 13, wherein the second transistor is in parallel with the third transistor.

15. A method comprising:

receiving a logic input;

pulling up a first node to a first voltage using a first transistor;

after a delay has elapsed, stopping the pull up using the first transistor;

maintaining the first node at the first voltage via a second transistor after stopping the pull up; and pulling down the first node to a second voltage by overpowering the second transistor with a pull-down transistor, wherein the second transistor is smaller than the pull-down transistor.

16. The method of claim 15, further comprising:

when pulling down the first node via the pull-down transistor, pulling up a second node to the first voltage using a third transistor;

after a second delay has elapsed, stopping the pull up using the third transistor;

maintaining the second node at the first voltage via a fourth transistor after stopping the pull up; and pulling down the second node to the second voltage by overpowering the fourth transistor with a second pull-down transistor.

17. The method of claim 16, further comprising:

upon pulling the second node up to the first voltage, decoupling the first node from the first voltage via a fifth transistor based at least in part on a voltage level at the second node.

18. The method of claim 17, further comprising:

outputting an output voltage at the first node.

19. The method of claim 18, further comprising:

inverting the output voltage twice; and receiving, at a NOR gate, the output voltage and the twice-inverted output voltage.

20. The method of claim 15, wherein the second transistor is smaller than the first transistor.

* * * * *